(12) United States Patent
Chen et al.

(10) Patent No.: US 7,808,573 B2
(45) Date of Patent: Oct. 5, 2010

(54) DISPLAY (LCOS) PANEL MODULE HAVING AN ADHESIVE ON A SUBTRATE WITH A FLEXIBLE PRINTED CIRCUIT (FPC) HAVING AN OPENING SO THAT THE LCOS PANEL MAY BE ADHESIVELY CONNECTED TO THE SUBSTRATE AND ELECTRICALLY CONNECTED TO THE FPC THROUGH THE OPENING

(75) Inventors: Yen-Chen Chen, Tainan County (TW);
Bing-Jei Liao, Tainan County (TW);
Chia-Chang Tien, Tainan County (TW);
Wen-Liang Wu, Tainan County (TW)

(73) Assignee: Himax Display, Inc., Tainan County (TW)

( * ) Notice: Subject to any disclaimer, the term of this patent is extended or adjusted under 35 U.S.C. 154(b) by 201 days.

(21) Appl. No.: 12/191,848

(22) Filed: Aug. 14, 2008

(65) Prior Publication Data

US 2010/0039603 A1     Feb. 18, 2010

(51) Int. Cl.
*G02F 1/1333*   (2006.01)
*G02F 1/1345*   (2006.01)

(52) U.S. Cl. .............................. 349/58; 349/5; 349/150; 349/161

(58) Field of Classification Search ................ 349/5–10, 349/58–60, 150, 161
See application file for complete search history.

(56) References Cited

U.S. PATENT DOCUMENTS

| | | | |
|---|---|---|---|
| 6,069,677 A * | 5/2000 | Kitai | 349/111 |
| 2002/0158828 A1* | 10/2002 | Isami et al. | 345/89 |
| 2004/0130897 A1* | 7/2004 | Kojima et al. | 362/294 |
| 2006/0001821 A1* | 1/2006 | Dewa et al. | 349/150 |
| 2006/0274222 A1* | 12/2006 | Shu | 349/58 |
| 2009/0109354 A1* | 4/2009 | Chen | 349/8 |

* cited by examiner

*Primary Examiner*—John Heyman
(74) *Attorney, Agent, or Firm*—J.C. Patents

(57) ABSTRACT

An LCOS panel module including a substrate, a flexible printed circuit (FPC), an LCOS panel, and a face mask is provided. The substrate has an adhesive region on a surface thereof. The FPC is disposed on the substrate and has an opening for exposing the adhesive region. The LCOS panel has a bottom surface and a top surface. The bottom surface of the LCOS panel is fixed on the adhesive region of the substrate exposed from the opening through an adhesive layer and is electrically connected to the FPC. The face mask used for framing the display region of the LCOS panel and sheltering from stray light is disposed on the LCOS panel and has a display opening. A display region of the top surface of the LCOS panel is exposed from the display opening of the face mask.

19 Claims, 5 Drawing Sheets

DISPLAY (LCOS) PANEL MODULE HAVING AN ADHESIVE ON A SUBTRATE WITH A FLEXIBLE PRINTED CIRCUIT (FPC) HAVING AN OPENING SO THAT THE LCOS PANEL MAY BE ADHESIVELY CONNECTED TO THE SUBSTRATE AND ELECTRICALLY CONNECTED TO THE FPC THROUGH THE OPENING

BACKGROUND OF THE INVENTION

1. Field of the Invention

The present invention generally relates to a display panel module, and more particularly, to a liquid crystal on silicon (LCOS) panel module.

2. Description of Related Art

In recent years, liquid crystal display (LCD) has gradually replaces the conventional cathode ray tube (CRT) as the mainstream display device because LCD is lighter and slimmer and has a lower operating voltage and power consumption and a radiation-free operation. However, there are still a number of technical limitations imposed on the LCD devices. In general, the use of LCD is limited to a display product having a screen below 30 inches. For a display device having a screen between 30 inches to 60 inches, plasma display panel (PDP) should have a better future development. Nevertheless, the high cost of production has deterred consumers to accept this product.

As a result of the high cost of production of the PDP, display devices that utilize the projection technique, for example, the reflective projection display apparatus and the rear projection display apparatus, have a very good prospect in the marketplace. Both the reflective projection display apparatus and the rear projection display apparatus use a reflective liquid crystal on silicon (LCOS) panel. Because reflective LCOS panel has a low production cost, a high aperture ratio (up to 90%), a high resolution (the pixel size can be 12 μm or smaller), most major manufacturers have an agenda to develop such techniques.

FIG. 1 is a perspective view showing a conventional LCOS module. Referring to FIG. 1, the LCOS module 10 comprises an LCOS panel 12 and a flexible printed circuit board 16 electrically coupled to the LCOS panel 12 for transferring image signals to the LCOS panel 12 in order to display an image. The conventional LCOS module 10 has no package structure; instead it directly contacts with an outside environment.

SUMMARY OF THE INVENTION

Accordingly, the present invention is directed to an LCOS panel module. The LCOS panel module has a face mask disposed on the LCOS panel, and the face mask has a display opening, such that the display region of the LCOS panel may be exposed from the display opening exactly. Therefore, the problems encountered in the prior art may be resolved.

The present invention is directed to an LCOS panel module. The LCOS panel module comprises a substrate, a flexible printed circuit (FPC), an LCOS panel, and a face mask. The substrate has an adhesive region on a surface thereof. The FPC is disposed on the substrate and has an opening for exposing the adhesive region. The LCOS panel has a bottom surface and a top surface. The bottom surface of the LCOS panel is fixed on the adhesive region of the substrate exposed from the opening through an adhesive layer and is electrically connected to the FPC. The face mask is disposed on the LCOS panel and has a display opening. A display region of the top surface of the LCOS panel is exposed from the display opening of the face mask.

According to an embodiment of the present invention, the LCOS panel module further comprises a plurality of bonding wires connected between the FPC and the LCOS panel.

According to an embodiment of the present invention, LCOS panel module further comprises a protection glue disposed on the FPC and covering the bonding wires.

According to an embodiment of the present invention, a material of the substrate comprises aluminum.

According to an embodiment of the present invention, a material of the face mask comprises steel or engineering plastic.

According to an embodiment of the present invention, the face mask is fixed on the LCOS panel through an adhesive.

According to an embodiment of the present invention, two ends of the face mask are bent downwards to the substrate and are fixed on the substrate through an adhesive.

According to an embodiment of the present invention, the face mask further comprises two fixing sidewalls connected to two sides of the face mask.

According to an embodiment of the present invention, the face mask further comprises a mounting hole for connecting with an optical engine.

According to an embodiment of the present invention, the face mask further comprises a positioning hole for aligning with a positioning mark on the top surface of the LCOS panel.

The present invention is also directed to an LCOS panel module. The LCOS panel module comprises a substrate, an LCOS panel, and a face mask. The substrate has a circuit and an adhesive region on a surface thereof. The LCOS panel has a bottom surface and a top surface. The bottom surface of the LCOS panel is fixed on the adhesive region of the substrate through an adhesive layer and is electrically connected to the circuit of the substrate. The face mask is disposed on the LCOS panel and has a display opening. A display region of the top surface of the LCOS panel is exposed from the display opening of the face mask.

According to an embodiment of the present invention, the LCOS panel module further comprises a plurality of bonding wires connected between the substrate and the LCOS panel, such that the LCOS panel is electrically connected to the substrate through the bonding wires.

According to an embodiment of the present invention, the LCOS panel module further comprises a protection glue disposed on the substrate and covering the bonding wires.

According to an embodiment of the present invention, a material of the substrate comprises ceramics.

According to an embodiment of the present invention, a material of the face mask comprises steel or engineering plastic.

According to an embodiment of the present invention, the face mask is fixed on the LCOS panel through a tape.

According to an embodiment of the present invention, two ends of the face mask are bent downwards to the substrate and are fixed on the substrate through an adhesive.

According to an embodiment of the present invention, the face mask further comprises two fixing sidewalls connected to two sides of the face mask.

According to an embodiment of the present invention, the face mask further comprises a mounting hole for connecting with an optical engine.

According to an embodiment of the present invention, the face mask further comprises a positioning hole for aligning with a positioning mark on the top surface of the LCOS panel.

The LCOS panel module of the present invention is to place the face mask on the LCOS panel for framing the display region of the LCOS panel and sheltering from stray light. Since the face mask is fixed on the LCOS panel with the display region of the LCOS panel being exposed from the display opening of the face mask precisely, the problems encountered in the prior art due to the accumulative tolerance of mounting the LCOS panel to the substrate may be resolved.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
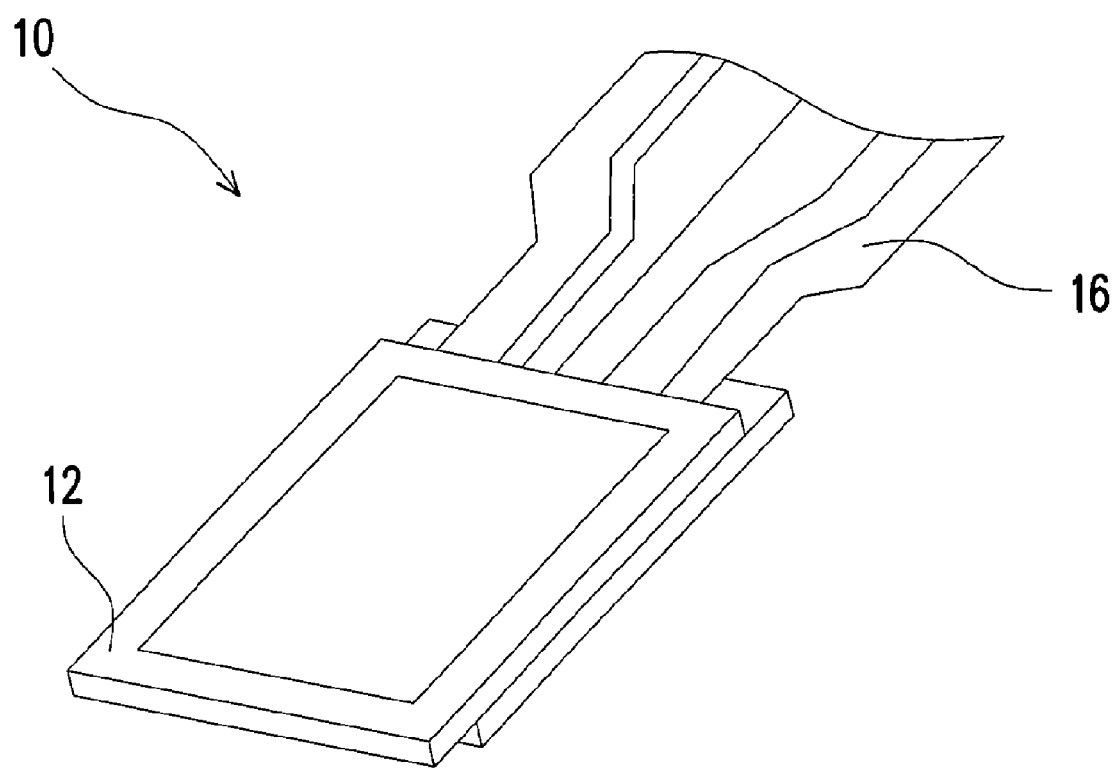
FIG. 1 is a perspective view showing a conventional LCOS module.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
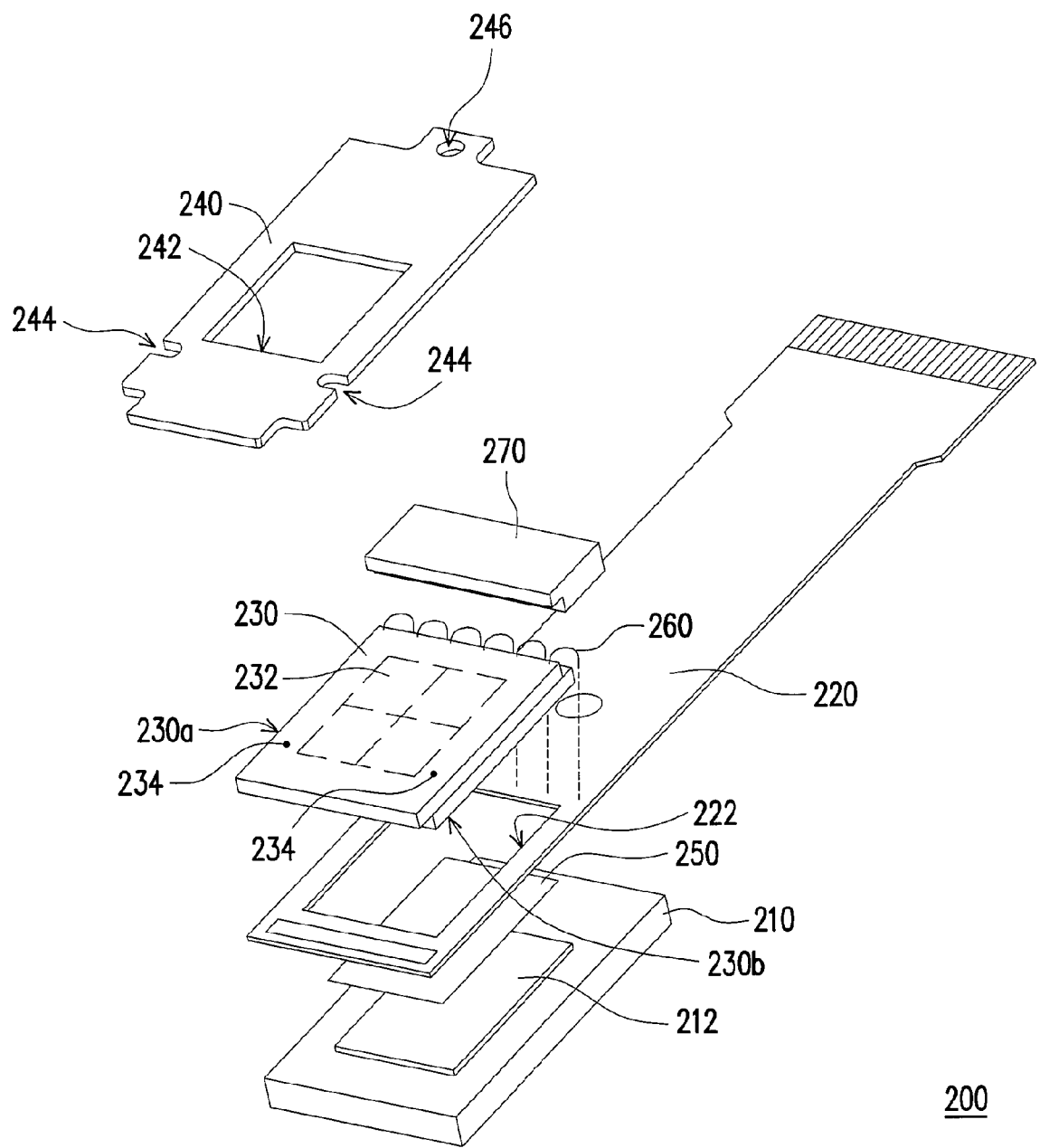
FIG. 2A is a three dimensional exploded view showing an LCOS panel module according to an embodiment of the present invention.
Figure 2B:
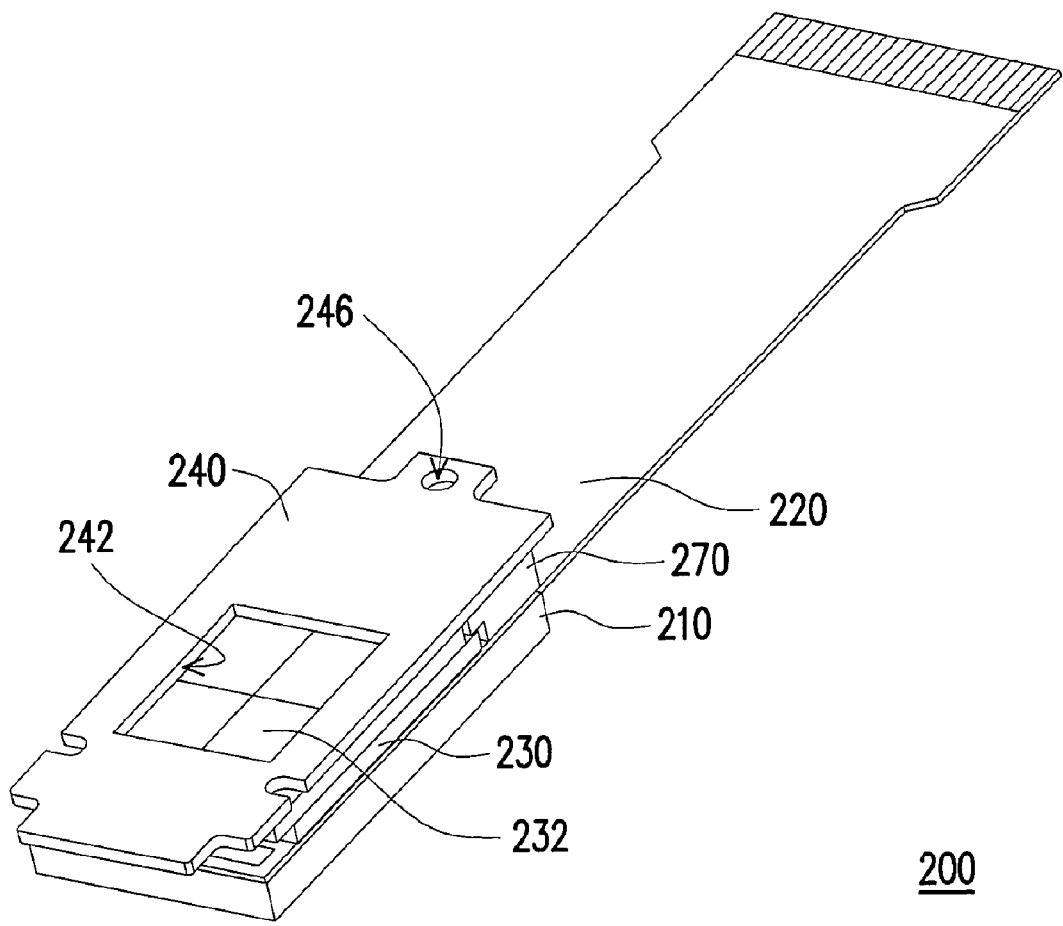
FIG. 2B is a three dimensional diagram showing the LCOS panel module shown in FIG. 2A after assembly.

FIG. 2A is a three dimensional exploded view showing an LCOS panel module according to an embodiment of the present invention. FIG. 2B is a three dimensional diagram showing the LCOS panel module shown in FIG. 2A after assembly. Referring to FIGS. 2A and 2B, the LCOS panel module 200 according to an embodiment of the present invention mainly comprises a substrate 210, a flexible printed circuit (FPC) 220, an LCOS panel 230, and a face mask 240. The elements of the LCOS panel module 200 and the connections between the elements are illustrated as following.

The substrate 210 is used for supporting the LCOS panel 230 and other elements, and the substrate 210 has an adhesive region 212 on a surface thereof. The adhesive region 212 can be part of the surface of the substrate 210 or an island formed thereon. Further, the adhesive region 212 can be flat or rough. In this embodiment, the substrate 210 is made of aluminium and also serves as a heat dissipation element. The FPC 220 having a control circuit for controlling the operation of the LCOS panel 230 is disposed on the substrate 210 and has an opening 222 for exposing the adhesive region 212 of the substrate 210. The LCOS panel 230 has a bottom surface 230b and a top surface 230a opposite to the bottom surface 230b. As shown in FIG. 2A, the LCOS panel 230 has a display region 232 on the top surface 230a and a non-display region surrounding thereof. Besides, the bottom surface 230b of the LCOS panel 230 is fixed on the adhesive region 212 of the substrate 210 exposed from the opening 222 through an adhesive layer 250 and is electrically connected to the FPC 220. In this embodiment, the adhesive layer 250 is a thermal tape for fixing the LCOS panel 230 on the substrate 210 and dissipating heat. Also, any adhesive element can be used for the adhesive layer 250 and should not limit in the embodiment. Further, in another embodiment, the FPC 220 may be formed without the opening 222 and the LCOS panel 230 is fixed on the FPC 220 by adhesive layer 250. The LCOS panel 230 is electrically connected to the FPC 220 through a plurality of bonding wires 260 connected therebetween. Besides, the LCOS panel module 200 may further comprise a protection glue 270 formed on the FPC 220 and covering the bonding wires 260. The protection glue 270 is used for protecting the bonding wires 260 from damage and humidity.

The embodiment of the present invention is to dispose the face mask 240 on the LCOS panel 230 for framing the display region 232 of the LCOS panel 230 and sheltering from stray light. The face mask 240 has a display opening 242 corresponding to the display region 232 of the LCOS panel 230, and the display region 232 of the LCOS panel 230 is exposed from the display opening 242 of the face mask 240. Since the face mask 240 is directly fixed on the LCOS panel 230 with the display region 232 precisely exposed from the display opening 242 of the face mask 240, the problem of assembly tolerance encountered in the prior art may be resolved. In one embodiment of the present invention, the face mask 240 has a pair of positioning holes 244 and the LCOS panel 230 has a pair of positioning marks 234 in the non-display region. Since the face mask 240 is directly fixed on the LCOS panel 230 through an adhesive, such as a tape or other suitable manner, the couple of positioning holes 244 can be self-aligned with the couple of the positioning marks 234. Besides, the face mask 240 may further comprise a mounting hole 246, and the mounting hole 246 is used to fixedly connect with an optical engine for reducing the accumulative tolerance. As mentioned before, the face mask 240 is directly adhered to the LCOS panel 230 and the face mask 240 is directly mounted to the optical engine, the accumulative tolerances from panel to optical engine are decreasing accordingly. The face mask 240 can be made of steel or engineering plastic, and furthermore a non-reflective material is preferred. Furthermore, the LCOS panel module can be minimized when the size of the face mask 240 correspond with the size of the LCOS panel 230, moreover, the face mask 240 can be acted as a light shielding to shelter the non-display region.

Figure 3A:
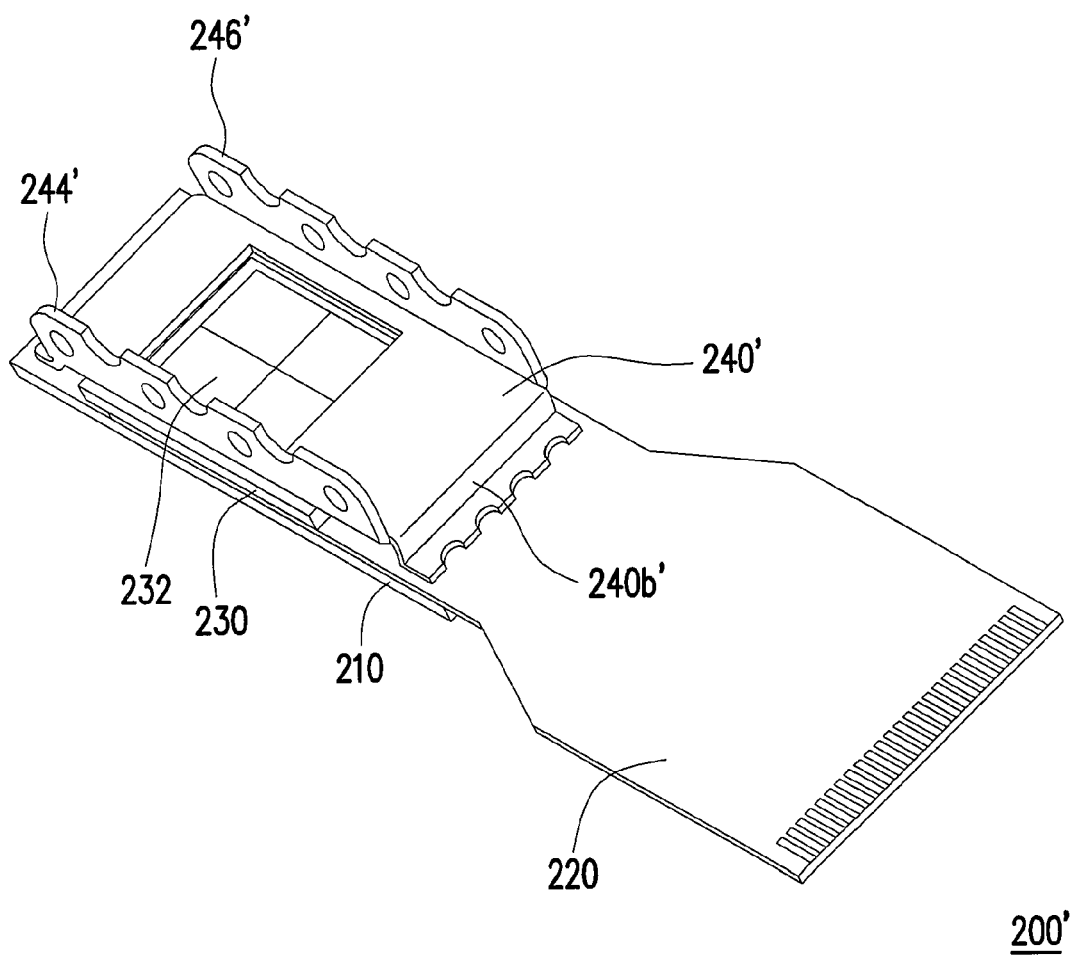
FIG. 3A is a three dimensional diagram showing an LCOS panel module according to another embodiment of the present invention.
Figure 3B:
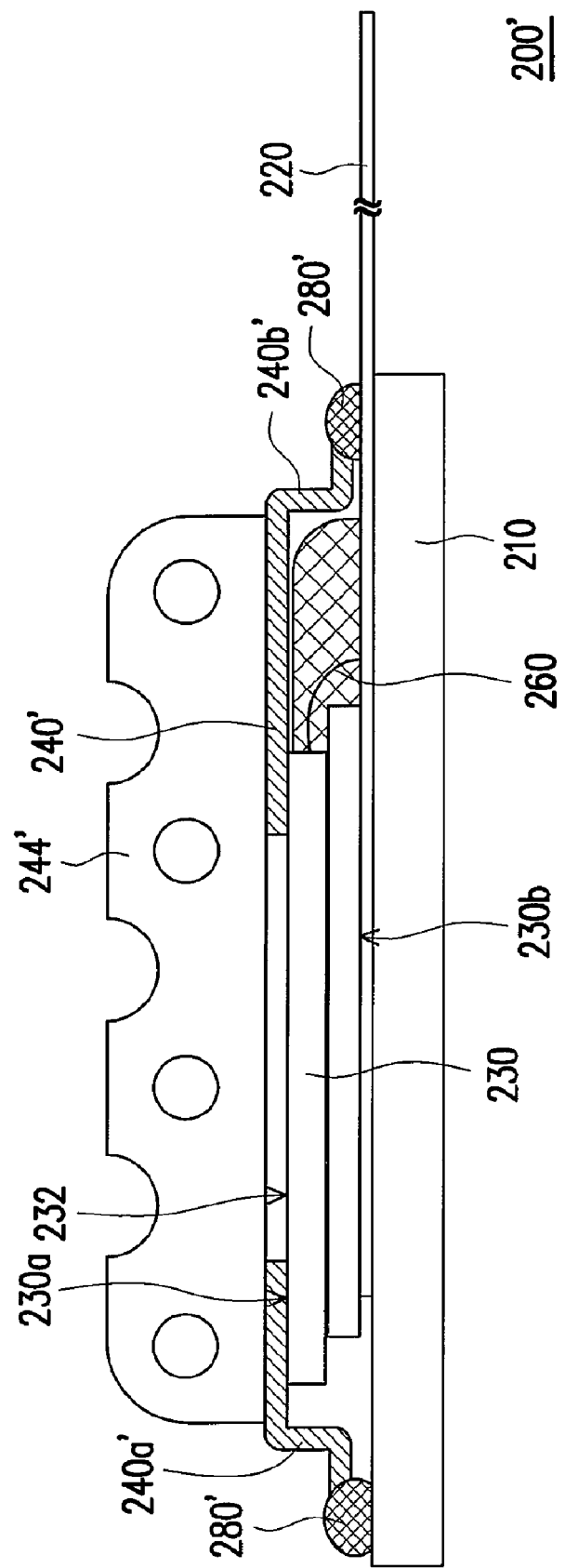
FIG. 3B is a schematic cross-sectional view showing the LCOS panel module as shown in FIG. 3A.

FIG. 3A is a three dimensional diagram showing an LCOS panel module according to another embodiment of the present invention. FIG. 3B is a schematic cross-sectional view showing the LCOS panel module as shown in FIG. 3A. Referring to FIGS. 3A and 3B, the LCOS panel module 200' is similar to the LCOS panel module 200 as shown in FIG. 2B, and the difference between them lies in that the two ends 240a' and 240b' of the face mask 240' as shown in FIGS. 3A and 3B are bent downwards to the substrate 210 and are fixed on the substrate 210 through an adhesive 280' for enhancing the bonding strength between the face mask 240' and the panel module. The height of the two ends 240a' and 240b' bent downwards to the substrate 210 is smaller than the height of the LCOS panel 230. Besides, as shown in FIGS. 3A and 3B, the face mask 240' may further comprise two fixing sidewalls 244' and 246' connected to two sides of the face mask 240', and these fixing sidewalls 244' and 246' are used to enhance the structural strength of the face mask 240' and connect with an optical engine to be assembled. Furthermore, these fixing sidewalls 244' and 246' may be connected with an optical engine by using screws or an adhesive.

The above-mentioned face mask 240 or 240' may also be applied to another kind of LCOS panel module, and the said kind of LCOS panel module comprises a substrate, an LCOS panel, and a face mask. The arrangement of these elements is similar to that as shown in FIG. 2A, and it is not repeated herein. The difference between them lies in that the substrate has a circuit fabricated thereon and therefore there is no need to place a FPC in the LCOS panel. In this embodiment, the substrate 210 may be made of ceramic or printed circuit board (PCB) and the substrate 210 is electrically connected with the control circuit via the connector. For example, the control circuit is fabricated below the substrate 210, the LCOS panel 230 is electrically connected with the control circuit by way of the via of the substrate 210. The LCOS panel 230 is electrically connected with the substrate 210 without the FPC 220, therefore can reduced the volume of the LCOS panel module.

In summary, the LCOS panel module of the present invention is to place the face mask on the LCOS panel for framing the display region of the LCOS panel and sheltering from stray light. Since the face mask is fixed on the LCOS panel with the display region of the LCOS panel being exposed from the display opening of the face mask precisely, the problems encountered in the prior art due to the accumulative tolerance of mounting the LCOS panel to the substrate may be resolved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A liquid crystal on silicon (LCOS) panel module, comprising:
    a substrate, having an adhesive region on a surface thereof;
    a flexible printed circuit (FPC), disposed on the substrate and having an opening for exposing the adhesive region;
    an LCOS panel, having a bottom surface and a top surface, wherein the bottom surface of the LCOS panel is fixed on the adhesive region of the substrate exposed from the opening through an adhesive layer and is electrically connected to the FPC; and
    a face mask, disposed on the LCOS panel and having a display opening, wherein a display region of the top surface of the LCOS panel is exposed from the display opening of the face mask.

2. The LCOS panel module according to claim 1, further comprising a plurality of bonding wires connected between the FPC and the LCOS panel.

3. The LCOS panel module according to claim 2, further comprising a protection glue disposed on the FPC and covering the bonding wires.

4. The LCOS panel module according to claim 1, wherein a material of the substrate comprises aluminum.

5. The LCOS panel module according to claim 1, wherein a material of the face mask comprises steel or engineering plastic.

6. The LCOS panel module according to claim 1, wherein the face mask is fixed on the LCOS panel through an adhesive.

7. The LCOS panel module according to claim 1, wherein two ends of the face mask are bent downwards to the substrate and are fixed on the substrate through an adhesive.

8. The LCOS panel module according to claim 1, wherein the face mask further comprises two fixing sidewalls connected to two sides of the face mask, and the fixing sidewalls extend in a direction away from the substrate.

9. The LCOS panel module according to claim 1, wherein the face mask further comprises a mounting hole for connecting with an optical engine.

10. The LCOS panel module according to claim 1, wherein the face mask further comprises a positioning hole for aligning with a positioning mark on the top surface of the LCOS panel.

11. A liquid crystal on silicon (LCOS) panel module, comprising:
    a substrate, having a circuit and an adhesive region on a surface thereof;
    an LCOS panel, having a bottom surface and a top surface, wherein the bottom surface of the LCOS panel is fixed on the adhesive region of the substrate through an adhesive layer and is electrically connected to the circuit of the substrate; and
    a face mask, disposed on the LCOS panel and having a display opening, wherein a display region of the top surface of the LCOS panel is exposed from the display opening of the face mask, and two ends of the face mask are bent downwards to the substrate and are fixed on the substrate through an adhesive.

12. The LCOS panel module according to claim 11, further comprising a plurality of bonding wires connected between the substrate and the LCOS panel, such that the LCOS panel is electrically connected to the substrate through the bonding wires.

13. The LCOS panel module according to claim 12, further comprising a protection glue disposed on the substrate and covering the bonding wires.

14. The LCOS panel module according to claim 11, wherein a material of the substrate comprises ceramics.

15. The LCOS panel module according to claim 11, wherein a material of the face mask comprises steel or engineering plastic.

16. The LCOS panel module according to claim 11, wherein the face mask is fixed on the LCOS panel through a tape.

17. The LCOS panel module according to claim 11, wherein the face mask further comprises two fixing sidewalls connected to two sides of the face mask, and the fixing sidewalls extend in a direction away from the substrate.

18. The LCOS panel module according to claim 11, wherein the face mask further comprises a mounting hole for connecting with an optical engine.

19. The LCOS panel module according to claim 11, wherein the face mask further comprises a positioning hole for aligning with a positioning mark on the top surface of the LCOS panel.

* * * * *